US012572078B2

(12) United States Patent
Patel et al.

(10) Patent No.: US 12,572,078 B2
(45) Date of Patent: Mar. 10, 2026

(54) RADIATION SOURCE MODULE AND LITHOGRAPHIC APPARATUS

(71) Applicant: ASML Netherlands B.V., Veldhoven (NL)

(72) Inventors: Hrishikesh Patel, Eindhoven (NL); Yue Ma, Escondido, CA (US); Güneş Nakiboğlu, Eindhoven (NL); Albert Pieter Rijpma, Veldhoven (NL); Antonius Johannus Van Der Net, Tilburg (NL); Rens Henricus Verhees, Eindhoven (NL); Zongquan Yang, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 414 days.

(21) Appl. No.: 18/225,439

(22) Filed: Jul. 24, 2023

(65) Prior Publication Data

US 2023/0367224 A1 Nov. 16, 2023

Related U.S. Application Data

(62) Division of application No. 16/626,125, filed as application No. PCT/EP2018/065113 on Jun. 8, 2018, now abandoned.

(Continued)

(51) Int. Cl.
*G03F 7/00* (2006.01)
*H05G 2/00* (2006.01)

(52) U.S. Cl.
CPC ...... *G03F 7/70033* (2013.01); *G03F 7/70916* (2013.01); *H05G 2/0092* (2024.08)

(58) Field of Classification Search
CPC . G03F 7/70033; G03F 7/70916; H05G 2/005; H05G 2/008; H05G 2/0092
See application file for complete search history.

(56) References Cited

U.S. PATENT DOCUMENTS 6,889,763 B1 5/2005 Subramanian et al.
7,476,886 B2 1/2009 Bykanov et al.
(Continued)

FOREIGN PATENT DOCUMENTS

CN 101790764 A 7/2010
JP 2004-165638 A 6/2004
(Continued)

OTHER PUBLICATIONS

Japanese Notice of Reasons for Refusal directed to related Japanese Patent Application No. 2019-566359, mailed Sep. 27, 2022; 8 pages.
(Continued)

*Primary Examiner* — Sean M Luck
(74) *Attorney, Agent, or Firm* — Finnegan, Henderson, Farabow, Garrett & Dunner, LLP

(57) ABSTRACT

A radiation source includes a fuel supply, a collector, a debris mitigation system, and a temperature control system. The fuel supply device supplies fuel. The excitation device excites the fuel into a plasma. The collector collects radiation emitted by the plasma and directs the radiation to a beam exit. The debris mitigation system collects debris generated by the plasma and has a first component having a first conduit passing therethrough and a second component having a second conduit passing therethrough. The temperature control system increases or decreases temperatures of the first component and the second component by selectively heating or cooling a thermal transfer fluid circulating through the respective conduit. The temperature control system cools the first component to a first temperature that (Continued)

is below the melting point of the fuel and heats the second component to a second temperature that is above the melting point of the fuel.

20 Claims, 8 Drawing Sheets

Related U.S. Application Data

(60) Provisional application No. 62/569,105, filed on Oct. 6, 2017, provisional application No. 62/523,911, filed on Jun. 23, 2017.

(56)                    References Cited

U.S. PATENT DOCUMENTS

| | | | |
|---|---|---|---|
| 7,852,460 B2 | 12/2010 | Bakker et al. | |
| 8,067,756 B2 | 11/2011 | Ueno et al. | |
| 8,748,853 B2 * | 6/2014 | Nagai | H05G 2/0094 |
| | | | 250/504 R |
| 8,785,892 B2 | 7/2014 | Ershov et al. | |
| 10,394,141 B2 | 8/2019 | Riepen et al. | |
| 2004/0165161 A1 | 8/2004 | Hara | |
| 2007/0158595 A1 | 7/2007 | McGeoch | |
| 2008/0309893 A1 | 12/2008 | Buis et al. | |
| 2010/0127186 A1 | 5/2010 | Bykanov et al. | |
| 2010/0208221 A1 | 8/2010 | Kramer et al. | |
| 2010/0258748 A1 | 10/2010 | Vaschenko et al. | |
| 2011/0253913 A1 | 10/2011 | Nagai et al. | |
| 2012/0248343 A1 | 10/2012 | Nagai et al. | |
| 2013/0088694 A1 | 4/2013 | Van Boxtel et al. | |
| 2014/0203195 A1 | 7/2014 | Fleurov et al. | |
| 2014/0287140 A1 | 9/2014 | Perin | |
| 2014/0340659 A1 | 11/2014 | Van Schoot et al. | |
| 2015/0247679 A1 | 9/2015 | Nimi et al. | |
| 2016/0195714 A1 | 7/2016 | Metzmacher et al. | |
| 2016/0353561 A1 | 12/2016 | Enzmann et al. | |
| 2020/0124976 A1 | 4/2020 | Patel et al. | |

FOREIGN PATENT DOCUMENTS

| | | | |
|---|---|---|---|
| JP | 2007-005124 A | 1/2007 |
| JP | 2011-023403 A | 2/2011 |
| JP | 2013-084892 A | 5/2013 |
| JP | 2016-018701 A | 2/2016 |
| TW | 2014-03254 A | 1/2014 |
| WO | WO 2013/160083 A1 | 10/2013 |

OTHER PUBLICATIONS

International Search Report and Written Opinion of the International Searching Authority directed to related International Patent Application No. PCT/EP2018/065113, mailed Oct. 24, 2018; 17 pages.

International Preliminary Report on Patentability directed to related International Patent Application No. PCT/EP2018/065113, issued Dec. 24, 2019; 11 pages.

* cited by examiner

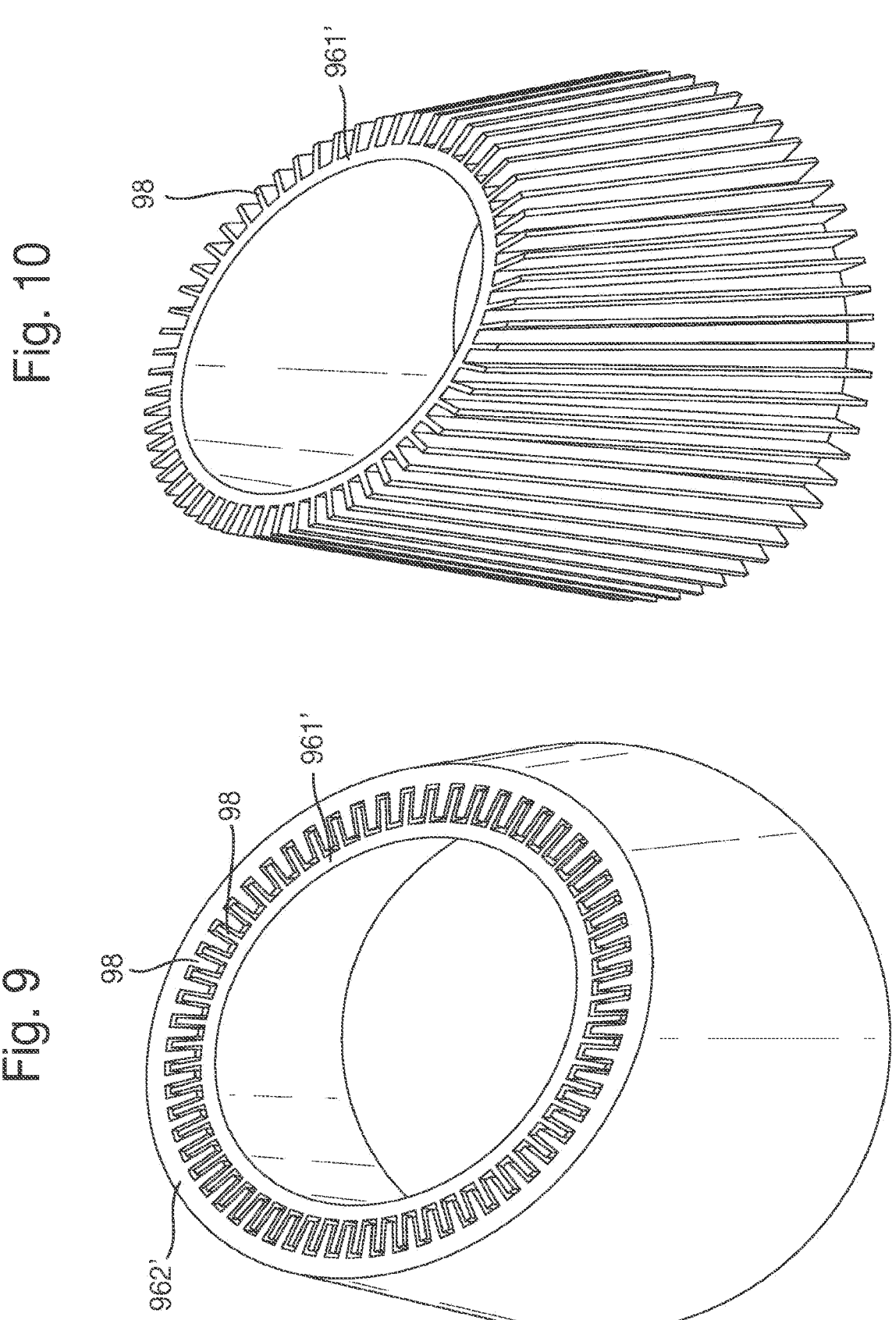

RADIATION SOURCE MODULE AND LITHOGRAPHIC APPARATUS

CROSS-REFERENCE TO RELATED APPLICATIONS

This application is a divisional application of U.S. application Ser. No. 16/626,125, filed Dec. 23, 2019, which is a National Stage Entry of international application no. PCT/EP2018/065113, filed Jun. 8, 2018, which claims benefit of U.S. application No. 62/523,911, filed Jun. 23, 2017, and U.S. application No. 62/569,105, filed Oct. 6, 2017, which are all incorporated herein in their entirety by reference.

FIELD

The present invention relates to radiation sources for EUV radiation, and to lithographic apparatus using such radiation sources.

BACKGROUND

A lithographic apparatus is a machine constructed to apply a desired pattern onto a substrate. A lithographic apparatus can be used, for example, in the manufacture of integrated circuits (ICs). A lithographic apparatus may for example project a pattern from a patterning device (e.g. a mask) onto a layer of radiation-sensitive material (resist) provided on a substrate.

The wavelength of radiation used by a lithographic apparatus to project a pattern onto a substrate determines the minimum size of features which can be formed on that substrate. A lithographic apparatus which uses EUV radiation, being electromagnetic radiation having a wavelength within the range 5-20 nm, may be used to form smaller features on a substrate than a conventional lithographic apparatus (which may for example use electromagnetic radiation with a wavelength of 193 nm).

EUV radiation can be generated by a plasma source in which a fuel, e.g. tin, is excited to form a plasma which then emits radiation. The fuel may be excited by a laser, in which case the source is referred to as a laser-produced plasma source (LPP source), or an electric discharge, in which case the source is referred to as a discharge-produced plasma source (DPP source). As well as the useful EUV radiation, a plasma source emits a lot of other radiation and a lot of particulate debris: ranging in size from electrons to small particles of the fuel. It is important to prevent the debris entering the main part of the lithographic apparatus as contamination of any of the optical elements in the lithographic apparatus would severely impact its performance.

Thus the radiation source includes a debris mitigation system having various elements to capture and otherwise prevent debris exiting the source module into the rest of the lithographic apparatus. Some elements, e.g. vanes, of the debris mitigation system are intended to capture fuel debris and so are maintained at a temperature below the melting point of the fuel so that when fuel debris comes into contact with such an element it solidifies. However, the temperature of such elements must not be too low as this encourages growth of fuel deposits in undesirable forms, e.g. tin wool. Other elements of the debris mitigation system are maintained at a temperature higher than the fuel melting point to allow accumulated fuel to flow away. In addition, those elements of the debris mitigation system that are normally maintained below the fuel melting point must periodically be heated to a temperature above the fuel melting point to enable accumulated fuel to be removed.

Therefore, a known debris mitigation system of a plasma radiation source has a variety of heating systems and cooling systems to heat or cool respective elements of the debris mitigation system to their respective target temperatures. Known heating systems use electric heaters to supplement the energy absorbed from the plasma. The electric heaters may be directly attached to the elements being heated or heat air which is then used to heat the respective element. Known cooling systems use water to cool, in some cases with a gas-filled gap between the element being cooled and the water-filled conduits. The known heating and cooling systems are complex, inefficient and can result in undesirably large temperature gradients on elements of the debris mitigation systems.

SUMMARY

It is an aim of the embodiments to provide a radiation source for EUV radiation. According to the embodiments, a radiation source comprises a fuel supply device configured to supply fuel; an excitation device configured to excite the fuel into a plasma; a collector configured to collect radiation emitted by the plasma and to direct the radiation to a beam exit; a debris mitigation system configured to collect debris generated by the plasma, the debris mitigation system having a first component having a first conduit passing therethrough and a second component having a second conduit passing therethrough; and a temperature control system configured to selectively increase or decrease respective temperatures of the first component and the second component by selectively heating or cooling a thermal transfer fluid circulating through the respective conduit. The temperature control system is configured to cool the first component to a first temperature that is below the melting point of the fuel and to heat the second component to a second temperature that is above the melting point of the fuel.

According to another aspect of the embodiments, a lithographic apparatus comprises a radiation source, an illumination system configured to illuminate a patterning device with radiation from the radiation source, and a projection system arranged to project a pattern from the patterning device onto a substrate. The radiation source comprises a fuel supply device configured to supply fuel, an excitation device configured to excite the fuel into a plasma, a collector configured to collect radiation emitted by the plasma and to direct the radiation to a beam exit, a debris mitigation system configured to collect debris generated by the plasma, and a temperature control system. The debris mitigation system has a first component having a first conduit passing therethrough and a second component having a second conduit passing therethrough. The temperature control system is configured to selectively increase or decrease respective temperatures of the first component and the second component by selectively heating or cooling a thermal transfer fluid circulating through the respective conduit. The temperature control system is operative to cool the first component to a first temperature that is below the melting point of the fuel and to heat the second component to a second temperature that is above the melting point of the fuel.

BRIEF DESCRIPTION OF THE DRAWINGS

Embodiments of the invention will now be described, by way of example only, with reference to the accompanying schematic drawings, in which:

FIG. 3 is a graph of the boiling point of water as a function of pressure;

FIG. 6 depicts an embodiment of the cap of the radiation source;

FIG. 9 depicts another embodiment of the cap of the radiation source; and

FIG. 10 depicts the inner layer of the cap of FIG. 9.

DETAILED DESCRIPTION

Figure 1:
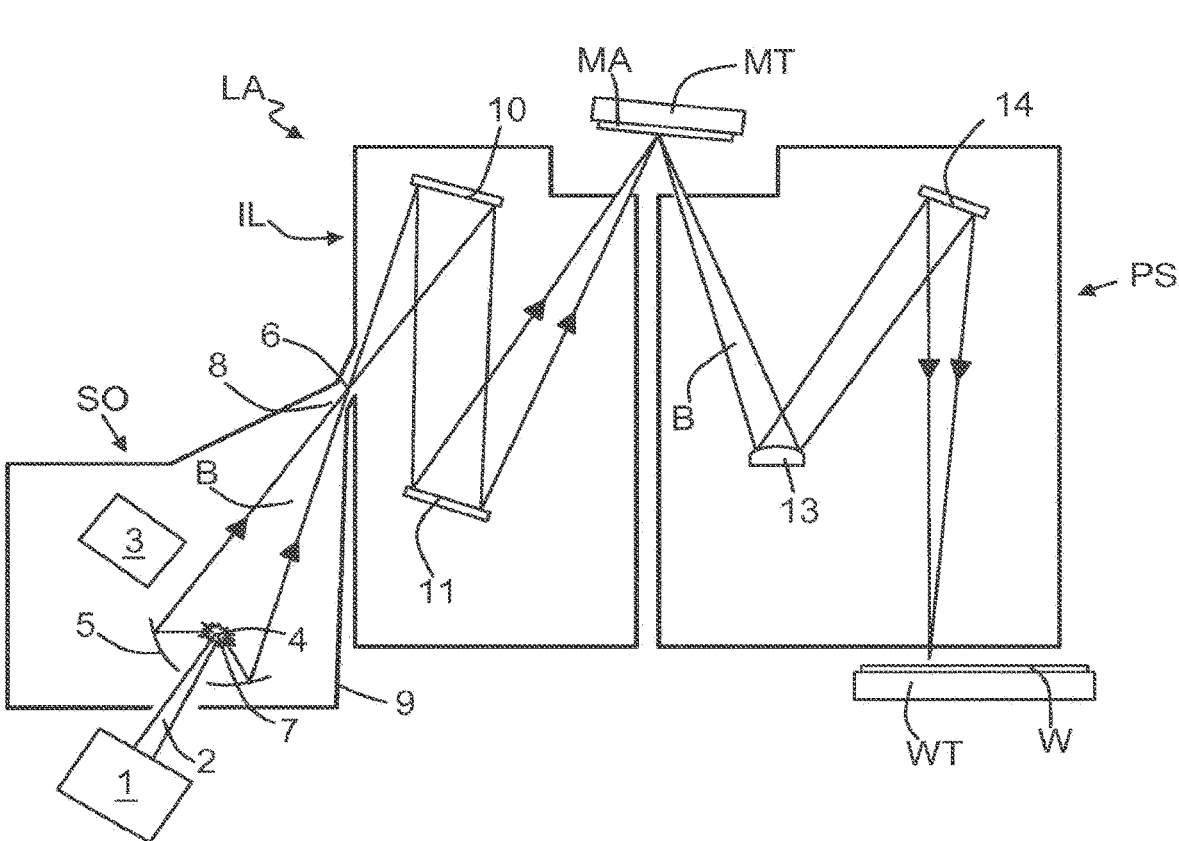
FIG. 1 depicts a lithographic system comprising a lithographic apparatus and a radiation source according to an embodiment of the invention.

FIG. 1 shows a lithographic system including a multilayer reflector according to one embodiment of the invention. The lithographic system comprises a radiation source SO and a lithographic apparatus LA. The radiation source SO is configured to generate an extreme ultraviolet (EUV) radiation beam B. The lithographic apparatus LA comprises an illumination system IL, a support structure MT configured to support a patterning device MA (e.g. a mask), a projection system PS and a substrate table WT configured to support a substrate W. The illumination system IL is configured to condition the radiation beam B before it is incident upon the patterning device MA. The projection system is configured to project the radiation beam B (now patterned by the mask MA) onto the substrate W. The substrate W may include previously formed patterns. Where this is the case, the lithographic apparatus aligns the patterned radiation beam B with a pattern previously formed on the substrate W.

The radiation source SO, illumination system IL, and projection system PS may all be constructed and arranged such that they can be isolated from the external environment. A gas at a pressure below atmospheric pressure (e.g. hydrogen) may be provided in the radiation source SO. A vacuum may be provided in illumination system IL and/or the projection system PS. A small amount of gas (e.g. hydrogen) at a pressure well below atmospheric pressure may be provided in the illumination system IL and/or the projection system PS.

The radiation source SO shown in FIG. 1 is of a type which may be referred to as a laser produced plasma (LPP) source). A laser 1, which may for example be a $CO_2$ laser, is arranged to deposit energy via a laser beam 2 into a fuel, such as tin (Sn) which is provided from a fuel emitter 3. Although tin is referred to in the following description, any suitable fuel may be used. The fuel may for example be in liquid form, and may for example be a metal or alloy. The fuel emitter 3 may comprise a nozzle configured to direct tin, e.g. in the form of droplets, along a trajectory towards a plasma formation region 4. The laser beam 2 is incident upon the tin at the plasma formation region 4. The deposition of laser energy into the tin creates a plasma 7 at the plasma formation region 4. Radiation, including EUV radiation, is emitted from the plasma 7 during de-excitation and recombination of ions of the plasma.

The EUV radiation is collected and focused by a near normal incidence radiation collector 5 (sometimes referred to more generally as a normal incidence radiation collector).

The collector 5 may have a multilayer structure (described further below) which is arranged to reflect EUV radiation (e.g. EUV radiation having a desired wavelength such as 13.5 nm). The collector 5 may have an elliptical configuration, having two ellipse focal points. A first focal point may be at the plasma formation region 4, and a second focal point may be at an intermediate focus 6, as discussed below.

The laser 1 may be separate from the radiation source SO. Where this is the case, the laser beam 2 may be passed from the laser 1 to the radiation source SO with the aid of a beam delivery system (not shown) comprising, for example, suitable directing mirrors and/or a beam expander, and/or other optics. The laser 1 and the radiation source SO may together be considered to be a radiation system.

Radiation that is reflected by the collector 5 forms a radiation beam B. The radiation beam B is focused at point 6 to form an image of the plasma formation region 4, which acts as a virtual radiation source for the illumination system IL. The point 6 at which the radiation beam B is focused may be referred to as the intermediate focus. The radiation source SO is arranged such that the intermediate focus 6 is located at or near to an opening (beam exit) 8 in an enclosing structure 9 of the radiation source.

The radiation beam B passes from the radiation source SO into the illumination system IL, which is configured to condition the radiation beam. The illumination system IL may include a facetted field mirror device 10 and a facetted pupil mirror device 11. The faceted field mirror device 10 and faceted pupil mirror device 11 together provide the radiation beam B with a desired cross-sectional shape and a desired angular distribution. The radiation beam B passes from the illumination system IL and is incident upon the patterning device MA held by the support structure MT. The patterning device MA reflects and patterns the radiation beam B. The illumination system IL may include other mirrors or devices in addition to or instead of the faceted field mirror device 10 and faceted pupil mirror device 11. The faceted field mirror device 10, faceted pupil mirror device 11 and other reflectors of the illumination system may have a multilayer structure as described further below.

Following reflection from the patterning device MA the patterned radiation beam B enters the projection system PS. The patterning device may include a reflector having a multilayer structure as described further below. The projection system comprises a plurality of mirrors which are configured to project the radiation beam B onto a substrate W held by the substrate table WT. The projection system PS may apply a reduction factor to the radiation beam, forming an image with features that are smaller than corresponding features on the patterning device MA. A reduction factor of 4 may for example be applied. Although the projection system PS has two mirrors in FIG. 1, the projection system may include any number of mirrors (e.g. six mirrors). The mirrors, and any other reflectors of the projection system PS, may have a multilayer structure as described further below.

The radiation source SO shown in FIG. 1 may include components which are not illustrated. For example, a spectral filter may be provided in the radiation source. The spectral filter may be substantially transmissive for EUV radiation but substantially blocking for other wavelengths of radiation such as infrared radiation.

Figure 2:
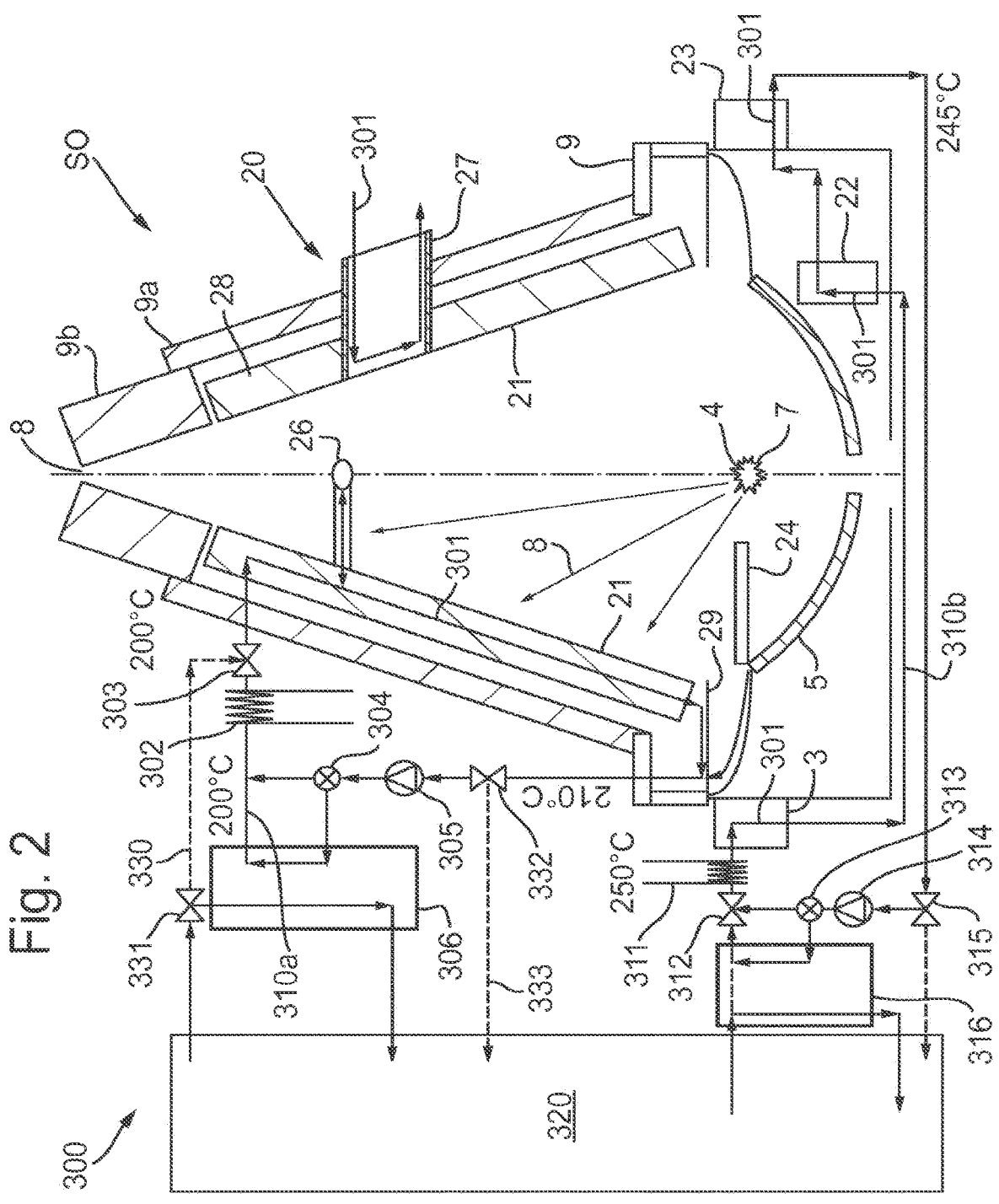
FIG. 2 depicts a radiation source according to an embodiment of the invention.

FIG. 2 shows in more detail the radiation source SO. In addition to the components identified above, the radiation source SO comprises a debris mitigation system 20 and a temperature control system 300. The debris mitigation system 20 comprises various components located within the enclosing structure 9 (also referred to as a vacuum chamber)

of the radiation source SO. The relevant components of the debris mitigation system 20 are provided with conduits 301 for the circulation of a thermal transfer fluid therethrough. The conduits 301 are connected to the temperature control system 300 which is mostly located outside the vacuum chamber 9. In particular, all active control devices of the temperature control system, such as valves and pumps are located outside the vacuum chamber 9.

The temperature control system 300 is configured to selectively heat or cool the thermal transfer fluid in order to heat or cool respective components of the debris mitigation system 20. When the radiation source is operating, some components of the debris mitigation system experience a high heat load since the efficiency of conversion of the energy used to excite plasma 7 into useful EUV radiation exiting through beam exit 8 is quite low. Therefore, in periods of operation of the radiation source, various components of the debris mitigation system require continuous cooling. As will be discussed further below, some components of the debris mitigation system 20 are desirably cooled to a temperature below the melting point of the fuel (e.g. tin) whilst others are desirably maintained at a higher temperature, above the melting point of the fuel.

Since debris accumulates on various components of the debris mitigation system 20, periodically such components of the radiation system 20 are heated to a temperature above the melting point of the fuel in order that the accumulated fuel can be melted and drain away. Since during this period the radiation source is not operating, a substantial heat input may be required to raise the temperature of the components of the debris mitigation system 20 sufficiently.

Generally, the largest component of the debris mitigation system 20 is a set of vanes 21 set in a conical arrangement around the path of radiation from the collector 5 to the beam exit 8. Vanes 21 collect the majority of debris ejected from the plasma 7 and are configured to minimise splashing of debris therefrom.

The debris mitigation system 20 also includes a debris bucket 22 located to collect liquid fuel running off the vanes 21 and a droplet catcher 23 located on the trajectory of droplets emitted by the droplet generator 3 after the plasma formation location 4. There is also a shroud 24 to protect the trajectory of droplets between the droplet generator 3 and plasma forming location 4. An obscuration member 26 (sometimes referred to a horizontal obscuration bar) is located directly on the optical axis of the radiation source between the plasma formation location 4 and beam exit 8 to block particulate debris traveling directly from the plasma 7 to the beam exit 8. The obscuration member 26 may comprise a disk supported by a strut projecting from one of the vanes 21. An exhaust and scrubber 27 is provided to extract gas from the vacuum chamber 9 and remove debris from the extracted gas. The upper part of the vacuum chamber includes a conical part 9A and a cap 9B closely surrounding the intermediate focus and defining the beam exit 8.

As mentioned, the vanes 21 receive the largest portion of the fuel debris in use and are cooled so that the fuel debris solidifies thereon and is thus collected rather than allowed to circulate within the lithographic apparatus. Solid fuel can therefore accumulate on the vanes quite rapidly and it is desirable to control the temperature of the vanes 21 in order to control the form of growth of the solidified fuel thereon. If the fuel is tin, then if the vanes 21 are too cool, e.g. about 150° C., the accumulating tin forms tin wool. Tin wool is a relatively low density form of tin comprising thin tin fibres. An accumulation of tin in the form of tin wool therefore projects further from the vanes than if the tin were to accumulate in a more compact form. Therefore, there is a risk that the tin wool will intercept the beam of useful radiation from the collector 5 to beam exit 8.

The temperature of the components of the debris mitigation system, especially the vanes, also influences other undesirable phenomena, for example tin spitting and tin dripping. Tin spitting occurs when molten tin on a surface reacts with hydrogen present in the vacuum chamber and results in tin particles being ejected into the vacuum chamber where they may absorb energy from the beam or travel into other parts of the lithographic apparatus. Tin dripping occurs when large amounts of molten tin accumulate and detach from a surface. This can result in large drops of tin falling onto the collector 5, reducing its reflectivity. Known cooling systems for components of the debris mitigation system can still result in large temperature gradients across certain components so that it becomes difficult to control the temperature of the components sufficiently to reduce the undesirable phenomena.

As shown in FIG. 2, a temperature control system 300 according to an embodiment of the invention circulates a thermal transfer fluid, in this case water, through conduits 301 provided within relevant components of the debris mitigation system 20. In an embodiment, the temperature conditioning system 300 is configured to circulate the thermal transfer fluid through some or all of the following components of the debris mitigation system 20: vanes 21, shroud 24, scrubber 27, debris bucket 22, droplet catcher 23, intermediate focus cap 9B, lower cone 28, droplet generator 3 and the heat shield 29.

In the embodiment of FIG. 2, the temperature control system 300 comprises two high pressure water circuits 310a, 310b. In some cases a single circuit can be used, in other cases more than two circuits may be desirable.

Figure 3:
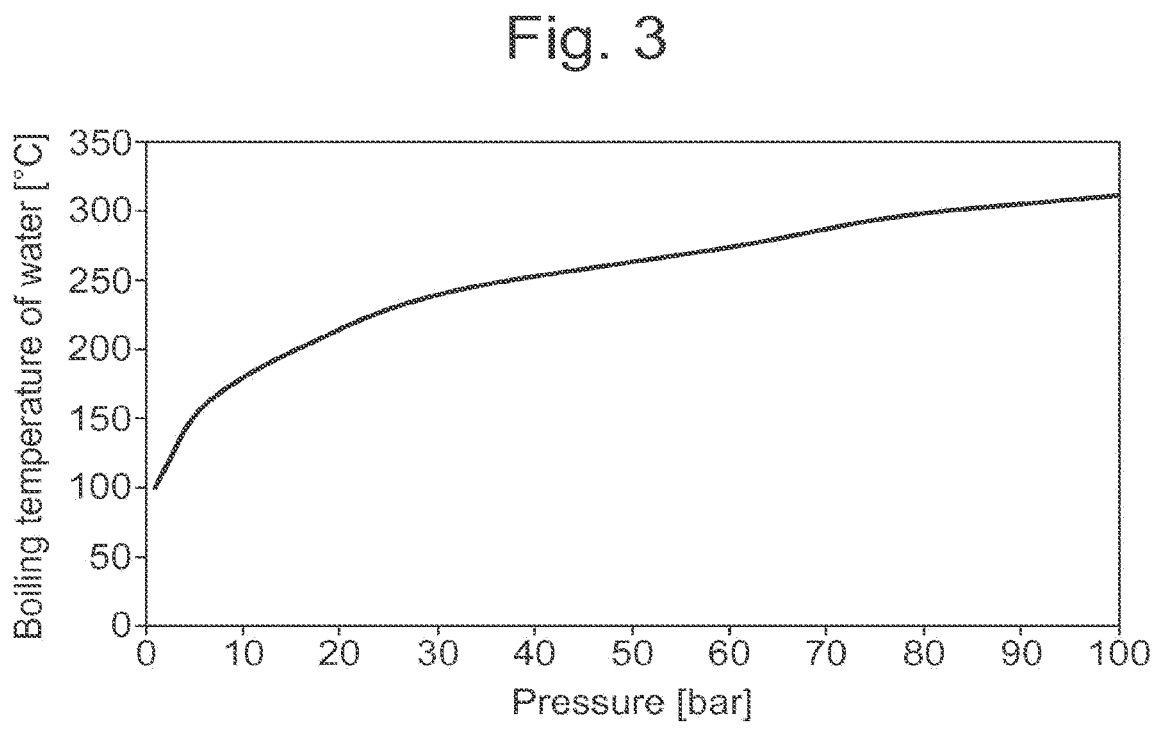

High pressure water circuit 310a is configured to control the temperature of the vanes 21, obscuration 26 and scrubber 27. An electric heater 302 is provided to heat the water as necessary whilst heat exchanger 306 is used to cool the circulating water when necessary. Heat exchanger 306 is connected to the main water supply 320 that is used for cooling other parts of the lithographic apparatus. Valve 304 is used to control whether returning water is sent to heat exchanger 306. A pump 305 is provided in high pressure water circuit 310a to circulate the water and maintain an appropriate pressure within the circuit to prevent the water boiling. It can be seen from FIG. 3, which is a graph of the boiling temperature of water as a function of pressure, that by maintaining the pressure within the high pressure water circuit 310 at about 50 bar it can be ensured that the water can be circulated at a temperature in the range of from 200 to 250° C. without risk of it boiling.

In addition, the control valves 303, 332 and 331 are provided so that cool water, e.g. at about 22° C., can be provided from main water supply 320 into the high pressure water circuit 310a if it is desired to rapidly cool down the relevant components of the debris mitigation system 20.

The second high pressure water circuit 310b in this embodiment is configured to control the temperature of the droplet generator 3, the debris bucket 22 and the droplet catcher 23. These components are desirably maintained at a higher temperature, above the melting point of the fuel, than the vanes 21 and obscuration member 26 which are temperature controlled using the first high pressure water circuit 310a. The second high pressure water circuit 310b comprises an electric heater 311 to heat the water as necessary and a heat exchanger 316 to cool the water when necessary by exchanging heat with water from the main water supply 320. Flow control valve 313 and pump 314 function to control flow of the water within the circuit and maintain it at an appropriate pressure. Similarly with first high pressure water circuit 310a, valves 312 and 315 are provided to enable cool water from the main supply 320 to be introduced directly into the circuit when it is desired to cool it down rapidly.

In an embodiment of the present invention using tin as the fuel, first circuit 310a is configured to maintain the relevant components of the debris mitigation system 20 at about 200° C. Therefore, water is supplied to the conduits 301 at a temperature of 200° C. Since the components such as the vanes 21 and obscuration member 26 experience a high heat load when the radiation source is operating, the water returning from the conduits 301 may be at an elevated temperature. By maintaining a flow rate of about 10 to 50 lpm it can be ensured that the temperature of the returning water does not rise above about 210° C. Different temperature ranges may apply if an alternative fuel is used and different flow rates may be appropriate depending on the power and conversion efficiency of the source. When it is desired to remove accumulated fuel from the vanes 21 and horizontal obscuration bar 26, the water entering the conduits 301 is heated to a higher temperature, e.g. about 250° C., in order to melt the accumulated tin.

In the second high pressure water circuit 310b it is desired to maintain the relevant components above the melting point of the fuel so that water is supplied to the conduits 301 at a temperature of about 250° C. Since the water aims to heat the components such as the droplet catcher 3, some cooling of the water occurs as it flows around the circuit. By maintaining a flow rate in the range of about 10 to 50 lpm, sufficient heat can be transferred to the relevant components whilst ensuring that the returning liquid does not drop in temperature too far, e.g. no lower than about 245° C.

This embodiment of the invention provides a number of advantages compared to prior art systems. By the use of high pressure water circuits to control the temperature, it is possible to achieve excellent control over temperature gradients and to readily change the temperature set point. Heating up and cooling down times can be reduced, improving throughput of the apparatus. Embodiments of the present invention are readily serviceable since all relevant controls and active components can be located outside the vacuum chamber. No parts that are likely to require replacement or servicing need be located within the vacuum chamber. By using the same fluid for both heating and cooling the components of the debris management system, the overall system is considerably simplified and the number of components required is reduced. The above described arrangement is also efficient in its use of electrical power.

It should be noted that in the above described embodiment of the present invention another liquid, such as an oil, may be substituted for the water as the thermal transfer fluid. However, water is desirable as having a high heat capacity and fewer safety issues than, for example, oil.

Figure 4:
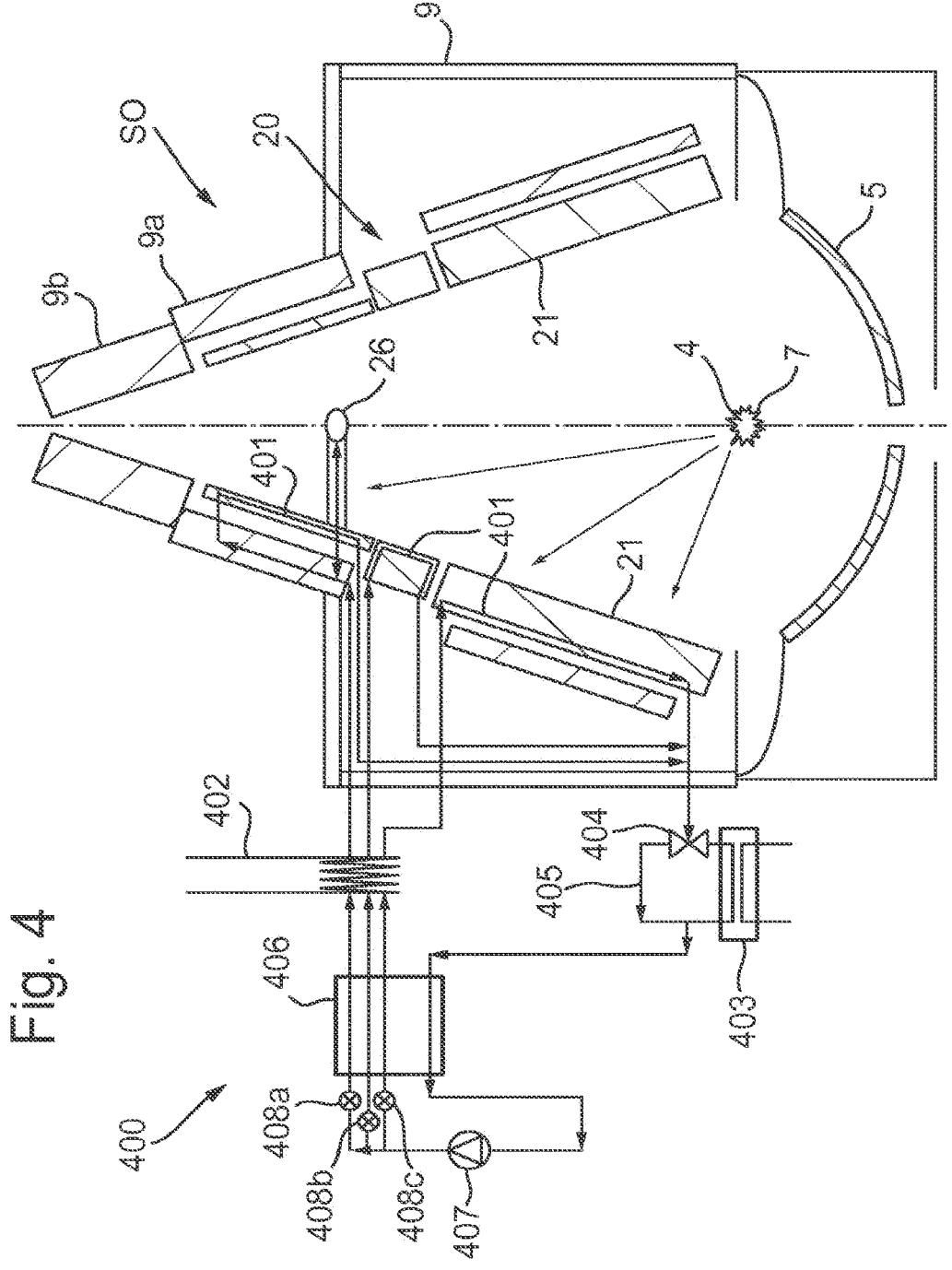
FIG. 4 depicts a radiation source according to another embodiment of the invention.

A further embodiment of a radiation source according to the present invention is depicted in FIG. 4. Parts of the radiation source of FIG. 4 that are the same as in the previous embodiment, in particular relating to the debris mitigation system, are indicated by like references and not described further herein for the sake of brevity. The radiation source SO of FIG. 4 can be used with a lithographic apparatus LA as depicted in FIG. 1.

In the radiation source SO of FIG. 4 heated gas, e.g. air, is used as the thermal transfer fluid. In embodiments of the present invention the heated air can be atmospheric air sourced from the environment around the apparatus or artificial air. As in the embodiment of FIG. 2, the thermal transfer fluid, in this case gas, is conducted through conduits 401 provided within components of the debris mitigation system 20. The same advantages, of simplification of manufacture and operation, as in the first embodiment are thereby achieved.

Temperature conditioning system 400 of the embodiment of FIG. 4 comprises a fan 407 that supplies pressurised air to a manifold from which control valves 408a, 408b, 408c control the flow of gas towards conduits 401 in respective components of the debris mitigation system 20. Gas flowing towards the conduit 401 is first heated by heat exchanger 406 to recover heat from gas that is returning from the conduit 401. It is then passed through an electric heater 402 which is controlled to heat the gas further if required, especially during a heat up phase. Gas that has flowed through the conduits 401 is combined into a single return path. The return path is configured so that the gas can pass through a cooler 403 if it is desired to remove heat from the system, or pass through bypass channel 405 to avoid the cooler 403, e.g. during a heat up phase. Control valve 404 is provided to control whether the return gas flows through the cooler 403 or the bypass channel 405. Thereafter, the returning gas passes through the heat exchanger 406 to give up heat towards the gas flowing towards the conduits 401. Returning gas is then recirculated by pump 407.

By providing heat exchanger 406 and positioning pump 407 and control valves 408a to 408c on the cold side of heat exchanger 406 it is not necessary to provide pumps and valves capable of withstanding elevated temperatures and therefore the serviceability and cost of the system is reduced.

Components of the debris mitigation system whose temperatures can be controlled in this embodiment include: the lower cone, the obscuration member, the scrubber, vanes 21, the heat shield, the debris bucket and the droplet catcher. For the sake of clarity, not all of these components are shown in FIG. 4. For larger components, such as the vanes 21, multiple conduits 401 may be provided in parallel as necessary to ensure even heat flow. The number of separate circuits can be varied according to the required heat flows and desired set points. As well as providing a single heater 402, separate heaters can be provided on each flow channel. If desired, the return flow paths from different circuits can be combined after the heat exchanger 406.

In view of the relatively low heat capacity of a gas such as air, compared to the water used in the embodiment of FIG. 2, a higher flow rate may be required. In an embodiment, the total flow rate of gas may be of the order of 1000 to 3000 slm. A large pump or a number of pumps may be required to achieve such a flow rate and it may be desirable therefore to locate these pumps away from the lithographic apparatus, e.g. in the fab subfloor. Such a location is advantageous in reducing transmission of vibrations from the pumps to the lithographic apparatus.

Figure 5:
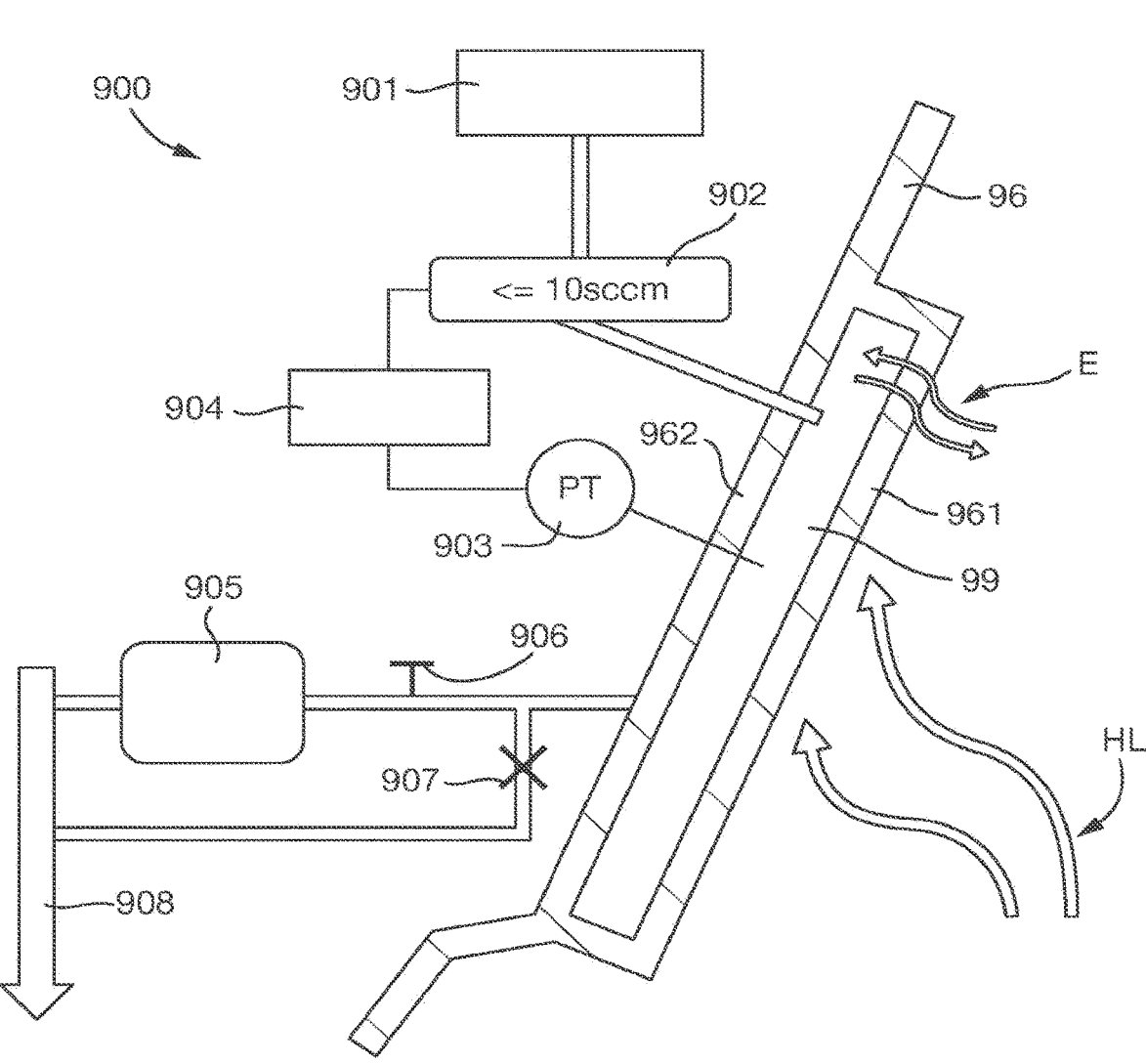
FIG. 5 depicts a temperature control arrangement for the cap of the radiation source.

FIG. 5 depicts an arrangement for controlling the temperature of the top cone 9b, which can also be referred to as the cap. Top cone 9b surrounds the exit aperture of the radiation source and receives a substantial heat load HL from the plasma and excitation laser beam. It is therefore necessary to extract heat from the top cone 9b whilst at the same time controlling the temperature thereof in order to control the accumulation of tin thereon. Temperature control can be based on feedback control or feedforward control or a combination of both. Feedforward control may be based on the operating status of the lithographic apparatus, e.g.

whether exposures are underway. In an embodiment, it is desirable to control the temperature of the top cone to a target of about 200° C. at some times and at other times to a target of about 600° C.

In an embodiment of the invention at least a part of the top cone 9b is constructed with two layers, an inner layer 961 and an outer 962 which together define a gap 99 therebetween. A temperature control system 900 is arranged to control heat transfer across the two-layer structure by controlling the pressure of gas in the gap. Temperature control system 900 includes a gas supply 901 which is connected to gap 99 via a mass flow controller 902. Mass flow controller 902 may include a controllable valve and a mass flow meter together with a controller to control the degree of opening of the valve in order to meet a target mass flow. A pressure and temperature sensor 903 measures the pressure and temperature of the gas in the gap 99 and is connected to a controller 904, e.g. a PID controller. Controller 904 provides a set point to mass flow controller 902 so as to achieve the desired pressure and temperature of the gas in the gap 99.

A vacuum pump 905 is also connected to the gap 99 via metering valve 906 in order to remove gas from the gap 99 when required. Gas removed from the gap 99 is sent to the main exhaust 908 of the apparatus. A bypass valve 907 may be provided for use during equivalent start up.

In an embodiment, the gap 99 is not perfectly sealed from the interior of the vacuum chamber 9. Therefore, there will be a gas exchange GE between the gap 99 and the main part of the vacuum chamber 9. In many cases, the net gas flow will be out of the gap 99 into the interior of the main vacuum chamber 9 so that a balancing in flow of gas is necessary to maintain the pressure in the gap 99 at the desired level. However, in other embodiments the gap 99 may be effectively completely sealed in which case an inflow of gas is only required when it is desired to increase the pressure in the gap 99. Maintaining a flow through the gap 99 can enable faster control of the gas pressure.

The heat flow across the gap 99 is dependent on the pressure of the gas in the gap 99. In an embodiment of the present invention, the pressure of the gas in the gap 99 is maintained in the range of from 0.01 Pa to 500 Pa. Desirably the gas in the gap is in the slip flow regime. In an embodiment the Knudsen number of the gas in the gap is about 1 or greater. When the Knudsen number is about 1 or greater, the heat transfer through the gap is strongly dependent on pressure. The outer layer 962 is maintained at a relatively low temperature, e.g. by a water-based temperature conditioning system, so that the interior of the vacuum chamber is maintained at a desired temperature by balancing the heat sources within the chamber and the heat transfer across the gap 99. In an embodiment of the invention, the width of the gap 99 is 3 mm so that the representative physical length scale L used to calculate the Knudsen number is about 6 mm. The gap can have a width of from about 1 mm to 10 mm, desirably 2 mm to 5 mm. If the gas is hydrogen then the Knudsen number in a 3 mm gap will be greater than 1 at a pressure of about 10 Pa at 200° C. and at a pressure of about 20 Pa at 650° C. It can be convenient to use hydrogen as the gas in the gap in an embodiment of the present invention because hydrogen is already present within the vacuum chamber 9 as part of the arrangements for mitigation of plasma debris. However, it is also possible to use other gases, such as inert gases like nitrogen, helium, argon and neon, or mixtures thereof.

Figure 6:
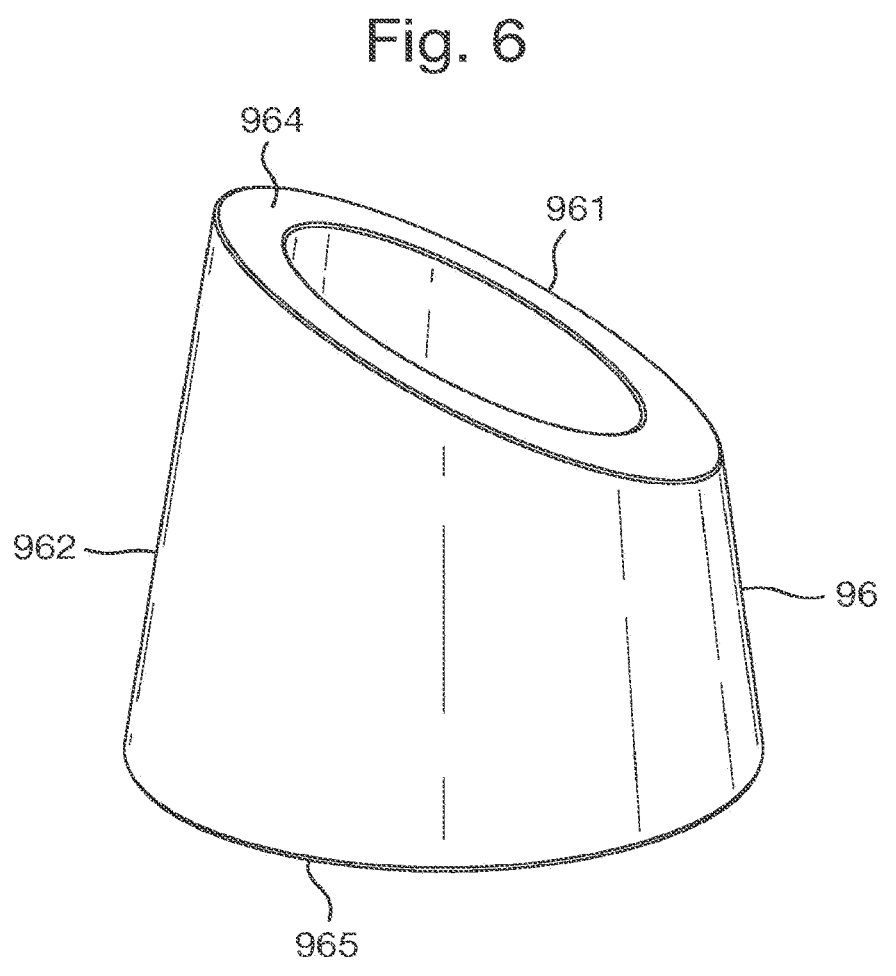
Figure 7:
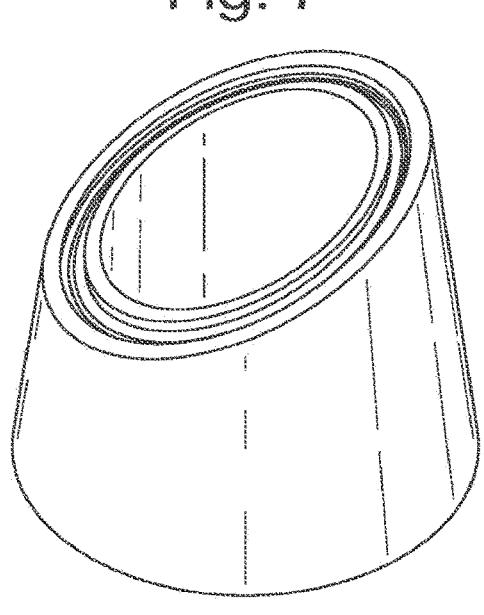
FIG. 7 depicts the cap of FIG. 6 with end plates removed.
Figure 8:
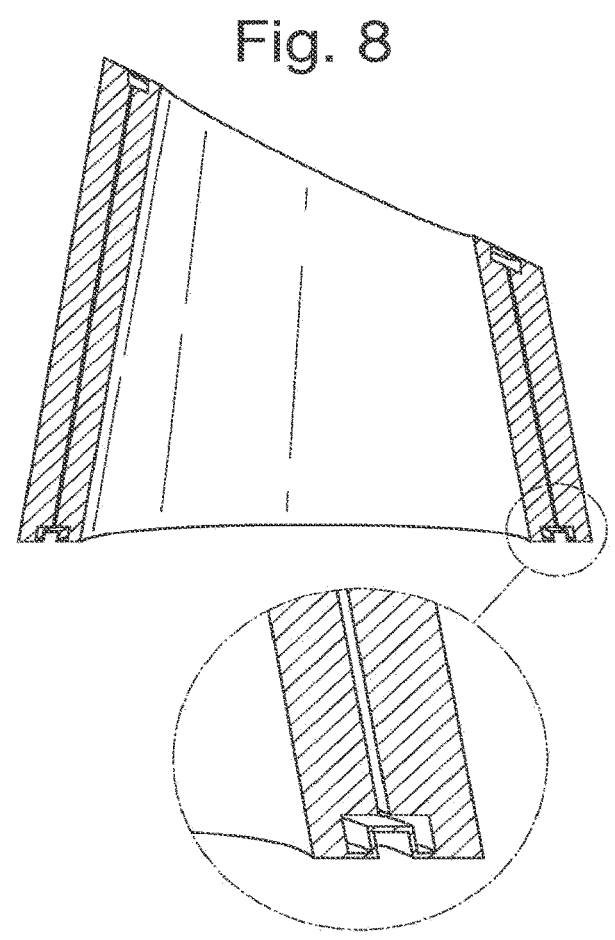
FIG. 8 depicts the cap of FIG. 6 in cross-section.

FIGS. 6 to 8 show an example of an end cap 9b according to an embodiment of the present invention. The top cone 9b is, for example, made of aluminium and may be provided with copper or molybdenum coatings on the interior surface of the inner layer 961 (which faces the plasma) as well as the surfaces which define the gap 99. The inner layer 961 and outer layer 962 can be constructed as nested cones with a space therebetween to form the gap 99. End plates 964 and 965 are provided to seal the gap. End plates 964, 965 can be formed of a nickel-chromium-based alloy such as Inconel. The copper or molybdenum coatings on the surfaces defining the gap 99 provide two advantages. Firstly, they are resistant to hydrogen embrittlement and secondly have a low emissivity so that the thermal transfer across the gap is better controlled by the pressure of gas in the gap.

The top cone 9b can also be constructed from metals such as aluminium, molybdenum, tungsten, steel, copper, nickel and composites thereof, or from non-metals such as boron nitride, aluminum nitride, aluminum oxide, boron carbide, graphite, and quartz.

FIGS. 9 and 10 depict an alternative structure for the end cap 9b. In the embodiment of FIGS. 9 and 10 the inner and outer layers 961' and 962' are provided with complementary sets of vanes 98. The interleaved vanes 98 have the effect of increasing the area of the gap 99 so as to increase heat transfer there-across whilst still maintain the gap at a desired thickness of a few mm, e.g. 1 mm to 10 mm. FIG. 9 shows an end view of the end cap 9b with end seal plates removed whilst FIG. 10 shows the inner layer 961 only. It can be seen that the vanes 98 extend in planes containing the axis of the cone formed by the top cone 9b to aid assembly if the inner and outer parts are formed as single pieces. Alternative configurations of vanes can be used if the two-parts of the top cone are themselves assembled from smaller parts.

The presence of interleaved vanes can hinder gas flow in the gap. To improve the uniformity of the pressure in the gap it is possible to provide multiple gas inlets and/or outlets spaced around the gap. Alternatively or in addition, one or more circumferential grooves or openings can be provided to assist gas flow around the gap.

In an embodiment, the gap 99 is divided into a plurality of segments so that the pressure of gas in the segments can be independently controlled. The gap can be segmented axially to form rings or circumferentially to form sectors or both. A thermal barrier can be provided to isolate the first wall layer from an adjacent part of the vacuum chamber wall.

If desired, a heater can be provided inside the cone to enable the vacuum chamber to be maintained at an elevated temperature when the other heat sources therein are insufficient.

The present embodiment enables control of the vacuum chamber at high temperatures not achievable with other systems. The present embodiment advantageously locates all components likely to require servicing, e.g. the valves and pumps, outside the vacuum chamber. This avoids the need to break the vacuum in the event servicing is required.

In an embodiment, the radiation source of the invention may form part of a mask inspection apparatus. The mask inspection apparatus may use EUV radiation to illuminate a mask and use an imaging sensor to monitor radiation reflected from the mask. Images received by the imaging sensor are used to determine whether or not defects are present in the mask. The mask inspection apparatus may include a processor configured to analyse the image of the mask at the imaging sensor, and to determine from that analysis whether any defects are present on the mask. The processor may further be configured to determine whether a detected mask defect will cause an unacceptable defect in images projected onto a substrate when the mask is used by a lithographic apparatus.

In an embodiment, the radiation source of the invention may form part of a metrology apparatus. A metrology apparatus may be used to measure alignment of a projected pattern formed in resist on a substrate relative to a pattern already present on the substrate. This measurement of relative alignment may be referred to as overlay. A metrology apparatus may be used to measure critical dimension (CD) of a target. A metrology apparatus may for example be located immediately adjacent to a lithographic apparatus and may be used to measure the overlay and/or CD before the substrate (and the resist) has been processed. The metrology apparatus may use EUV radiation for increased resolution.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

The term "EUV radiation" may be considered to encompass electromagnetic radiation having a wavelength within the range of 5-20 nm, for example within the range of 13-14 nm. EUV radiation may have a wavelength of less than 10 nm, for example within the range of 5-10 nm such as 6.7 nm or 6.8 nm.

Although the described radiation source is a laser produced plasma LPP source, the invention may be applied to other types of radiation source. For example, EUV emitting plasma may be produced by using an electrical discharge to convert fuel (e.g. tin) to a plasma state. A radiation source of this type may be referred to as a discharge produced plasma (DPP) source. The electrical discharge may be generated by a power supply which may form part of the radiation source or may be a separate entity that is connected via an electrical connection to the radiation source SO.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays (such as LED or OLED displays), liquid-crystal displays (LCDs), thin-film magnetic heads, etc.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

Other aspects of the invention are set out as in the following numbered clauses:

1. A radiation source comprising:
a fuel supply device configured to supply fuel;
an excitation device configured to excite the fuel into a plasma;
a collector configured to collect radiation emitted by the plasma and to direct the radiation to a beam exit;

a debris mitigation system configured to collect debris generated by the plasma, the debris mitigation system having a component having a conduit passing therethrough; and
a temperature control system configured to selectively increase or decrease the temperature of the component by selectively heating or cooling a thermal transfer fluid circulating through the conduit.
2. The radiation source of clause 1, wherein the temperature control system is operative in a first mode to cool the component to a first temperature that is below the melting point of the fuel and is operative in a second mode to heat the component to a second temperature that is above the melting point of the fuel.
3. The radiation source of clause 1, further comprising:
a vacuum chamber enclosing the collector and debris mitigation system; and
wherein all active flow control devices of the temperature control system are outside the vacuum chamber.
4. The radiation source of clause 1, wherein the component comprises a source chamber wall, an obscuration member, a scrubber, a vane, a heat shield, a shroud for a fuel supply trajectory, a droplet catcher or a debris bucket.
5. The radiation source of clause 1, wherein:
the debris mitigation system comprises a plurality of components each having a conduit passing therethrough, and
the temperature control system comprises a plurality of independently controllable circuits configured to circulate the thermal transfer fluid through respective components.
6. The radiation source of clause 5, wherein the plurality of independently controllable circuits comprises a first circuit configured to maintain a first set of components at a temperature lower than the melting point of the fuel and a second set of components at a temperature higher than the melting point of the fuel.
7. The radiation source of clause 1, wherein the debris mitigation system comprises a plurality of components each having a conduit passing therethrough, and the temperature control system comprises a circuit configured to circulate the thermal transfer fluid through a plurality of the components in series.
8. The radiation source of clause 1, wherein the fuel supply device comprises a droplet generator configured to supply droplets of tin as the fuel.
9. The radiation source of clause 1, wherein the excitation source comprises a laser.
10. A lithographic apparatus comprising:
a radiation source comprising:
a fuel supply device configured to supply fuel;
an excitation device configured to excite the fuel into a plasma;
a collector configured to collect radiation emitted by the plasma and to direct the radiation to a beam exit;
a debris mitigation system configured to collect debris generated by the plasma, the debris mitigation system having a component having a conduit passing therethrough; and
a temperature control system configured to selectively increase or decrease the temperature of the component by selectively heating or cooling a thermal transfer fluid circulating through the conduit;
an illumination system configured to illuminate a patterning device with radiation from the radiation source; and a projection system arranged to project a pattern from the patterning device onto a substrate.

The invention claimed is:

1. A radiation source comprising:
a fuel supply device configured to supply fuel;
an excitation device configured to excite the fuel into a plasma;
a collector configured to collect radiation emitted by the plasma and to direct the radiation to a beam exit;
a debris mitigation system configured to collect debris generated by the plasma, the debris mitigation system having a first component having a first conduit passing therethrough and a second component having a second conduit passing therethrough; and
a temperature control system configured to selectively increase or decrease respective temperatures of the first component and the second component by selectively heating or cooling a thermal transfer fluid circulating through the respective conduit, wherein
the temperature control system is configured to cool the first component to a first temperature that is below the melting point of the fuel and to heat the second component to a second temperature that is above the melting point of the fuel.

2. The radiation source of claim 1, wherein
the temperature control system is further configured to heat the first component to the second temperature that is above the melting point of the fuel or a third temperature that is above the melting point of the fuel.

3. The radiation source of claim 1, further comprising:
a vacuum chamber enclosing the collector and debris mitigation system,
wherein all active flow control devices of the temperature control system are outside the vacuum chamber.

4. The radiation source of claim 1, wherein the first component comprises a source chamber wall, an obscuration member, a scrubber, a vane, a heat shield, or a shroud for a fuel supply trajectory.

5. The radiation source of claim 1, wherein the second component comprises a droplet generator, a heat shield, a debris bucket, a shroud, or a droplet catcher.

6. The radiation source of claim 1, wherein
the temperature control system comprises a plurality of independently controllable circuits configured to circulate the respective thermal transfer fluid through the first component and the second component.

7. The radiation source of claim 6, wherein the plurality of independently controllable circuits comprises a first circuit configured to maintain the first component at a temperature lower than the melting point of the fuel and a second circuit configured to maintain the second component at a temperature higher than the melting point of the fuel.

8. The radiation source of claim 1, wherein:
the first component comprises a plurality of first components each having a respective conduit passing therethrough, and
the temperature control system comprises a circuit configured to circulate the thermal transfer fluid through the plurality of the first components in series.

9. The radiation source of claim 1, wherein:
the second component comprises a plurality of second components each having a respective conduit passing therethrough, and
the temperature control system comprises a circuit configured to circulate the thermal transfer fluid through the plurality of the second components in series.

10. The radiation source of claim 1, wherein the fuel supply device comprises a droplet generator configured to supply droplets of tin as the fuel.

11. The radiation source of claim 1, wherein the excitation source comprises a laser.

12. The radiation source of claim 1, wherein the debris mitigation comprises an end cap comprising an inner layer, an outer layer, and at least one end plate that connects the inner layer and outer layer.

13. The radiation source of claim 12, wherein the inner layer and the outer layer form nested cones.

14. The radiation source of claim 12, wherein:
the inner layer comprises a first set of vanes protruding outward from the inner layer; and
the outer layer comprises a second set of vanes complimentary to the first set of vanes and protruding inward from the outer layer.

15. The radiation source of claim 12, wherein:
a gap is formed between the inner layer and the outer layer; and
the temperature control system is operative to circulate the thermal transfer fluid through the gap.

16. The radiation source of claim 15, wherein
a width of the gap is greater than or equal to 1 mm and less than or equal to 10 mm.

17. The radiation source of claim 12, wherein
a temperature of the outer layer is maintained at a lower temperature than a temperature of the inner layer by circulating a cooling fluid through the gap.

18. A lithographic apparatus comprising:
a radiation source comprising:
    a fuel supply device configured to supply fuel;
    an excitation device configured to excite the fuel into a plasma;
    a collector configured to collect radiation emitted by the plasma and to direct the radiation to a beam exit;
    a debris mitigation system configured to collect debris generated by the plasma, the debris mitigation system having a first component having a first conduit passing therethrough and a second component having a second conduit passing therethrough; and
    a temperature control system configured to selectively increase or decrease respective temperatures of the first component and the second component by selectively heating or cooling a thermal transfer fluid circulating through the respective conduit, the temperature control system being operative to cool the first component to a first temperature that is below the melting point of the fuel and to heat the second component to a second temperature that is above the melting point of the fuel;
an illumination system configured to illuminate a patterning device with radiation from the radiation source; and
a projection system arranged to project a pattern from the patterning device onto a substrate.

19. The lithographic apparatus according to claim 18, wherein:
the first component comprises a plurality of first components;
the second component comprises a plurality of second components;
the temperature control system comprises a plurality of independently controllable circuits, each independently controllable circuit configured to circulate the thermal transfer fluid through a respective one of the plurality of first components and the plurality of second component.

20. A radiation source comprising:

a fuel supply device configured to supply fuel;

an excitation device configured to excite the fuel into a plasma;

a collector configured to collect radiation emitted by the plasma and to direct the radiation to a beam exit;

a debris mitigation system configured to collect debris generated by the plasma, the debris mitigation system having a component having a conduit passing there-through; and a temperature control system configured to selectively increase or decrease the temperature of the component by selectively heating or cooling a thermal transfer fluid circulating through the conduit.

* * * * *